(12) United States Patent
Uehling et al.

(10) Patent No.: US 11,018,024 B2
(45) Date of Patent: May 25, 2021

(54) METHOD OF FABRICATING EMBEDDED TRACES

(71) Applicant: NXP USA, Inc., Austin, TX (US)

(72) Inventors: Trent Uehling, New Braunfels, TX (US); Chee Seng Foong, Austin, TX (US)

(73) Assignee: NXP USA, INC., Austin, TX (US)

( * ) Notice: Subject to any disclaimer, the term of this patent is extended or adjusted under 35 U.S.C. 154(b) by 204 days.

(21) Appl. No.: 16/052,836

(22) Filed: Aug. 2, 2018

(65) Prior Publication Data
US 2020/0043750 A1 Feb. 6, 2020

(51) Int. Cl.
*H01L 21/48* (2006.01)
*H01L 21/027* (2006.01)
*H01L 23/00* (2006.01)
*H01L 23/498* (2006.01)

(52) U.S. Cl.
CPC ...... *H01L 21/4853* (2013.01); *H01L 21/0273* (2013.01); *H01L 21/481* (2013.01); *H01L 21/486* (2013.01); *H01L 23/49816* (2013.01); *H01L 23/49827* (2013.01); *H01L 23/49838* (2013.01); *H01L 23/562* (2013.01)

(58) Field of Classification Search
CPC .............. H01L 21/0273; H01L 21/481; H01L 21/482; H01L 21/4846; H01L 21/4853; H01L 21/4857; H01L 23/49816; H01L 23/49822; H01L 23/49827; H01L 23/49838; H01L 23/5381; H01L 23/562
See application file for complete search history.

(56) References Cited

U.S. PATENT DOCUMENTS

| | | | | |
|---|---|---|---|---|
| 5,227,008 A | * | 7/1993 | Klun | G03F 7/0325 |
| | | | | 216/33 |
| 5,615,477 A | * | 4/1997 | Sweitzer | H01L 23/49827 |
| | | | | 228/180.22 |
| 5,747,358 A | * | 5/1998 | Gorrell | H05K 3/4007 |
| | | | | 216/11 |

(Continued)

FOREIGN PATENT DOCUMENTS

| CA | 2554750 | * | 8/2005 |
|---|---|---|---|
| CN | 201859866 U | * | 6/2011 |

(Continued)

OTHER PUBLICATIONS

Lau, J., "Recent Advances and New Trends in Flip Chip Technology", ASME, Journal of Electronic Packaging, vol. 138. Sep. 2016.

*Primary Examiner* — Carl J Arbes

(57) ABSTRACT

Embodiments are provided herein for a substrate having one or more embedded traces and a method for fabricating one or more embedded traces. The method includes: forming a bump on a first major surface of a substrate, the bump having a height measured from the first major surface to a top surface of the bump; forming a trace comprising: a lower trace portion that directly contacts the first major surface, a sidewall trace portion that directly contacts at least one sidewall of the bump, and an upper trace portion that directly contacts the top surface of the bump; depositing a blanket dielectric layer over the trace; and etching away a top portion of the blanket dielectric layer to expose a top surface of the upper trace portion.

20 Claims, 11 Drawing Sheets

(56) References Cited

U.S. PATENT DOCUMENTS

| | | | | |
|---|---|---|---|---|
| 6,468,889 | B1 * | 10/2002 | Iacoponi | H01L 21/76898 |
| | | | | 257/E21.597 |
| 6,869,665 | B2 * | 3/2005 | Tani | H05K 1/056 |
| | | | | 174/250 |
| 7,002,080 | B2 * | 2/2006 | Tani | H05K 3/4641 |
| | | | | 174/255 |
| 7,348,045 | B2 * | 3/2008 | Yang | H05K 1/028 |
| | | | | 174/254 |
| 8,021,748 | B2 * | 9/2011 | Asai | H01L 23/145 |
| | | | | 428/323 |
| 8,127,979 | B1 | 3/2012 | Wu et al. | |
| 9,565,774 | B2 | 2/2017 | Lee | |
| 2004/0099441 | A1 * | 5/2004 | Ichiryu | H01L 23/49816 |
| | | | | 174/266 |

FOREIGN PATENT DOCUMENTS

| | | | |
|---|---|---|---|
| CN | 201859867 U | * | 6/2011 |
| WO | 2010/005592 A2 | * | 1/2010 |

* cited by examiner

METHOD OF FABRICATING EMBEDDED TRACES

BACKGROUND

Field

This disclosure relates generally to microelectronic packaging, and more specifically, to a substrate with embedded traces.

Related Art

Electronic components, such as semiconductor dies, are often attached to a substrate, which is often a board made of a non-conductive material that includes conductive structures to form electrical connections among the electronic components and external conductive structures. The substrate may be flexible or rigid, and provides sufficient mechanical support for the attached electronic components.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1A:
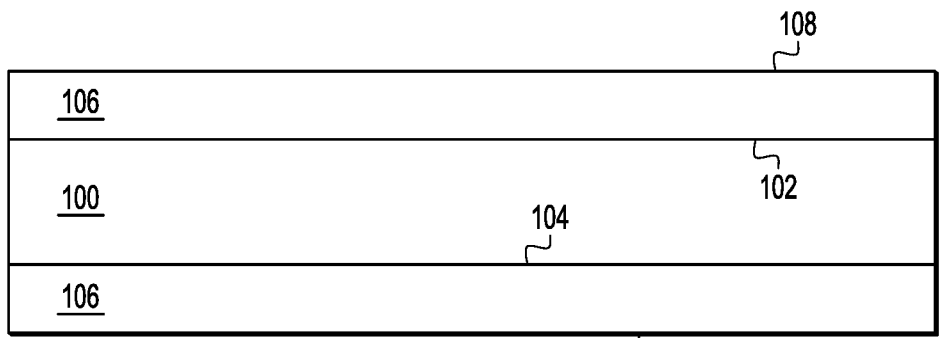
FIG. 1A-1K are block diagrams depicting an example embedded trace fabrication process flow, according to some embodiments of the present disclosure.

The following sets forth a detailed description of various embodiments intended to be illustrative of the invention and should not be taken to be limiting.

Overview

Fabricating a substrate may be expensive, depending on the technology used. For example, some technologies use a disposable carrier on which layers are built using an additive process, which is typically more expensive than using a copper-clad core and using a conventional build-up layer process. Further, as technology progresses, there is a greater need for a larger number of interconnects on a substrate.

The present disclosure provides methods for fabricating a substrate having one or more embedded traces. An embedded trace is a trace formed over a bump, which may be a dielectric bump or a metal bump formed on a major surface of the substrate. The trace extends along the major surface, along at least one sidewall of the bump, and along a top surface of the bump. The trace may be formed using photolithography and plating. The trace is embedded in dielectric material and a top surface of the portion of the trace located on top of the bump is exposed through the dielectric material. The top surface acts as a bondable surface, to which an electrical component or an external conductive structure such as a wire bond or a solder ball may be attached. The underlying bump provides mechanical support for attachment of the external conductive structure, where the embedded nature of the underlying bump and trace also serves to anchor the bondable surface from shifting during attachment. The bondable surface may be coplanar with the surrounding dielectric material, or may extend beyond the surrounding dielectric material to improve attachment.

The present disclosure also provides methods for fabricating a substrate having one or more metal-filled vias, which may be formed using photolithography and plating. The metal-filled vias may be stacked to form a column of metal-filled vias having a smooth vertical profile, as compared with microvias fabricated using conventional methods. The present disclosure also provides methods for fabricating a substrate having cross-directional traces, where one trace may extend along the major surface of a substrate, a dielectric bump is formed over the trace to serve as a "bridge," and another trace is formed over the dielectric bump to cross over the underlying trace.

The substrate disclosed herein provides mechanical support and electrically connects electronic components using conductive structures, which may include any number of embedded traces, bondable surfaces, metal-filled vias, and cross-directional traces, as discussed herein.

Example Embodiments

FIG. 1A-1K show cross-sectional views of various process steps in an example embedded trace fabrication process flow that includes forming a dielectric bump. The embedded trace fabrication process may be implemented as part of a build-up process, where a number of build-up layers (such as conductive layers and dielectric layers) are formed on a core board (such as a cladded or uncladded core board) to form a substrate, or a board that provides mechanical support and electrically connects electronic components using conductive structures, as discussed below. The embedded trace fabrication process may be implemented at various points during such a build-up process, such as during an initial phase of the build-up process to form a bump on or near a major surface of a core board, or during a later phase of the build-up process to form a bump near an outermost surface of the resulting substrate, or at any point in between to form a bump within the build-up layers of the substrate. The build-up layers include layers of conductive material, layers of dielectric material, or both, which are built up over the top side, the bottom side, or both top and bottom sides of the core board to form a substrate.

FIG. 1A shows a cross-sectional view of a substrate 100 with a top surface 102 and a bottom surface 104. In some embodiments, substrate 100 may be a bare or uncladded dielectric core board made of dielectric core material having a top dielectric surface 102 and a bottom dielectric surface 104. In other embodiments, substrate 100 may be a metal-cladded dielectric core board made of the dielectric core material with a metal layer laminated, coated, or otherwise bonded to the top surface of the dielectric core material to provide a top metal surface. Similarly, a metal layer may be laminated, coated, or otherwise bonded to the bottom surface of the dielectric core material to provide a bottom metal surface. The top and bottom metal surfaces are also covered (either completely or partially) with a dielectric material to provide a top dielectric surface 102 and a bottom dielectric surface 104. In some embodiments, substrate 100 may also include one or more build-up layers formed on either side of the substrate 100, where outermost top and bottom build-up layers of dielectric material on the substrate 100 respectively provide a top dielectric surface 102 and a bottom dielectric surface 104. Examples of the dielectric core material may include one or more of, but are not limited to: glass, fiberglass, FR4, BT resin, ceramic, polyimide, and the like. Examples of a cladding or metal layer may include but are not limited to a metal foil, such as copper foil or aluminum foil, which may be laminated on one side or on both sides of the dielectric core board material. Examples of dielectric material include but are not limited to silicon oxide, silicon nitride, silicon dioxide, silicon oxynitride, polyimide, other suitable materials including oxides, nitrides, and the like. Examples of conductive material include but are not limited to copper, gold, aluminum, or other suitable conductive material or alloy composed of one or more suitable metals.

Figure 1B:
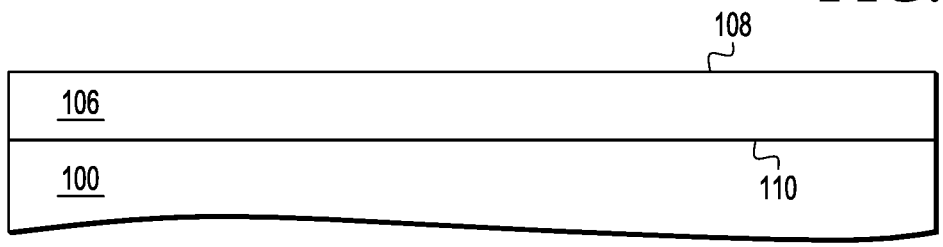
Figure 1C:
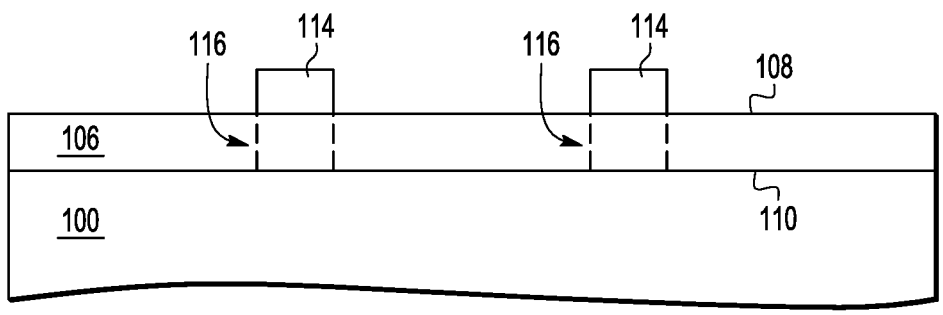

FIG. 1A also shows dielectric material deposited over the top and bottom surfaces 102 and 104 to form a layer 106 directly contacting the top surface 102 and a layer 106 directly contacting the bottom surface 104, with each layer 106 having an outer surface 108. Examples of depositing material (like dielectric material layer 106 or other material such as photoresist material) include but are not limited to growing, oxidizing, sputtering, and conformal depositing. It is noted that the surfaces 102 and 104 of the embodiments described herein may also referred to as major surfaces, such as first and second major surfaces. Layer 106 serves as a base dielectric layer 106 from which one or more dielectric bumps are formed, as further discussed below. In the following figures, only half of the substrate 100 is shown for simplicity's sake. For example, FIG. 1B shows a side of substrate 100 with major surface 110, which may be viewed as either the top side of the substrate 100 that includes top surface 102 or the bottom side of the substrate 100 that includes bottom surface 104, with base dielectric layer 106 directly formed on major surface 110. It is also noted that the process steps described herein may be applied to either the top side, the bottom side, or both sides of the substrate 100, in a sequential manner or in a concurrent manner.

FIG. 10 shows a layer of photoresist material deposited over the side of the substrate 100 and patterned into a photoresist mask 114 that directly contacts the outer surface 108 of base dielectric layer 106. A photoresist mask (like photoresist mask 114) may be patterned using ultraviolet (UV) light applied to the photoresist material through a photomask to develop (or cause the photoresist material to undergo a photochemical reaction) portions of the photoresist material into the photoresist mask, and then portions of the undeveloped photoresist material are removed to leave the patterned photoresist mask. Examples of the photoresist material include, but are not limited to: light-sensitive polymers or combined components that undergo a photochemical reaction when exposed to UV light through a photomask, such as polymethyl methacrylate (PMMA), a combination of phenolic resin matrix and sensitizer, and the like.

The patterned photoresist mask 114 includes a number of portions that each define an area 116 of the underlying base dielectric layer 106 in which a dielectric bump is to be formed. The placement of each portion of photoresist mask 114 defines the placement of a corresponding dielectric bump, and the perimeter shape of each portion of photoresist mask 114 corresponds to a perimeter shape of the corresponding dielectric bump. Each dielectric bump may have one of a number of shapes as viewed from a top-down view, such as a square shape, a rectangular shape, a curved shape (such as a circular or elliptical shape), a polygonal or multi-pronged shape (such as an L-shape or H-shape), and the like. In some embodiments, the location of each area 116 of base dielectric layer 106 corresponds to a target location of a bondable surface or a bond pad that will be formed over the resulting dielectric bump, as further discussed below.

Figure 1D:
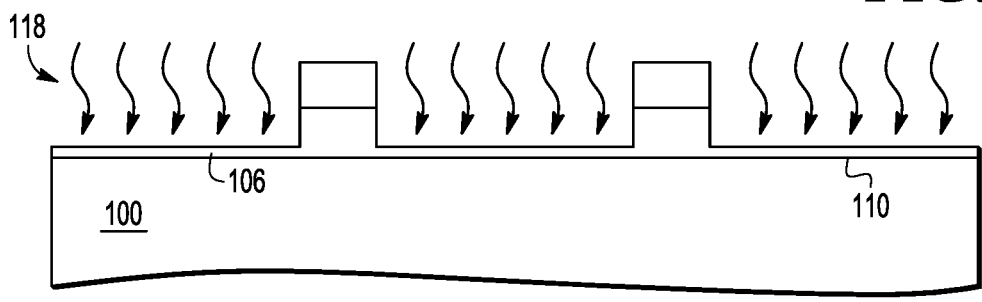

FIG. 1D shows an etching step 118 applied to the substrate 100 that removes the exposed portions of base dielectric layer 106 not covered by the photoresist mask 114, without substantially removing the underlying dielectric material at the major surface 110 of the substrate 100. Etching step 118 may be performed using an etchant that selectively etches the dielectric material of base dielectric layer 106, which may be a different dielectric material than the dielectric material at the major surface 110 of the substrate 100, or the etching step 118 may be limited to a predetermined amount of time to prevent substantial removal of the underlying dielectric material at the major surface 110. Examples of an etching step (like etching step 118) may include but are not limited to using wet or dry etchant techniques.

Figure 1E:
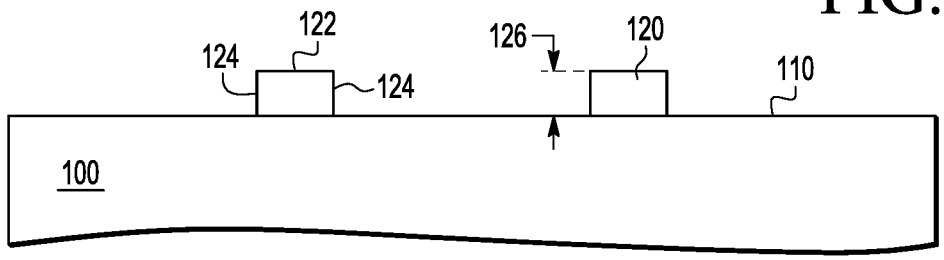

FIG. 1E shows the resulting dielectric bumps 120 that are formed after the etching step 118 has removed the exposed portions of base dielectric layer 106 and after the remaining portions of the photoresist mask 114 are removed. Each dielectric bump 120 has a height 126 that substantially corresponds to the height of the base dielectric layer 106, as measured from major surface 110. Each dielectric bump 120 also has a number of sidewalls 124 (e.g., four sidewalls if the perimeter of the bump 120 is a square or rectangle) and a top (planar) surface 122.

Figure 1F:
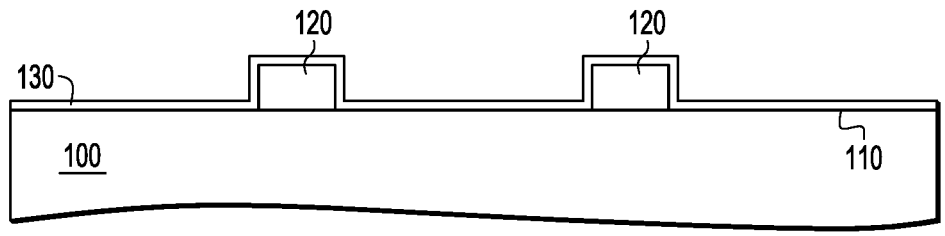

FIG. 1F shows a seed layer 130 deposited over the side of the substrate 100, including over major surface 110 and over each dielectric bump 120. Seed layer 130 makes direct contact with major surface 110, the sidewalls 124 of dielectric bump 120, and the top surface 122 of dielectric bump 120. Seed layer 130 is a conductive material, examples of which include but are not limited to copper, gold, aluminum, and the like. Examples of depositing a seed layer (like seed layer 130) may include but are not limited to sputtering, conformal depositing, and the like.

Figure 1G:
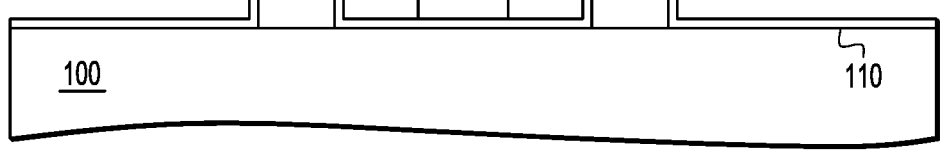

FIG. 1G shows a layer of photoresist material deposited over the side of substrate 100 and patterned into a photoresist mask 132 that directly contacts the seed layer 130. The patterned photoresist mask 132 includes a number of openings 129 that each define an area 131 in which a trace is to be formed, where the area 131 includes the dielectric bump. The location of each opening 129 defines the location of a corresponding trace, and the perimeter shape of each opening 129 corresponds to a perimeter of the corresponding trace.

Figure 1H:
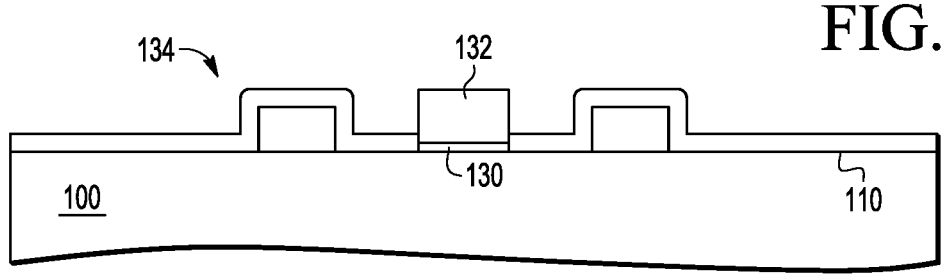

FIG. 1H shows a plating step 134 applied to the substrate 100 that plates exposed portions of the seed layer 130 within each opening 129. The portions of seed layer 130 that remain under photoresist mask 132 are not plated. Examples of a plating step (like plating step 134) may include but are not limited to using electroplating or electroless plating techniques, which may be performed for a predetermined amount of time that achieves a target thickness of the resulting plated conductive material.

Figure 1I:
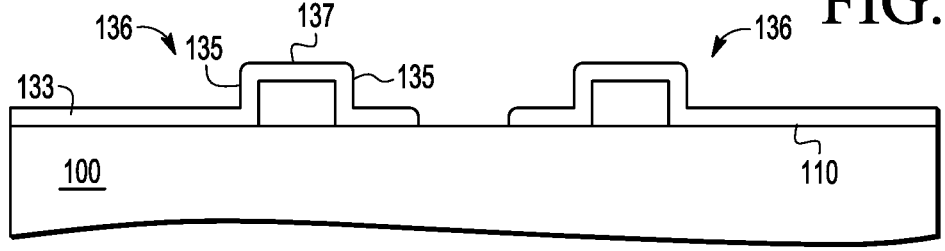

FIG. 1I shows the resulting traces 136 after the portions of the photoresist mask 132 and the underlying remaining portions of the seed layer 130 are removed, such as by using one or more additional etching steps. Each trace 136 includes a lower trace portion 133 that directly contacts the major surface 110, a sidewall trace portion 135 that directly contacts at least one sidewall of the dielectric bump 120, and an upper trace portion 137 that directly contacts the top surface 122 of dielectric bump 120. In some embodiments, a trace 136 may include a sidewall trace portion 135 that directly contacts up to and including all sidewalls of the dielectric bump 120. As further shown in FIG. 1K, each trace 136 generally has a consistent thickness shown as height 143 that corresponds to the combined thickness or height of the seed layer 130 and the conductive material plated onto the seed layer 130. In some embodiments, the height 126 of the dielectric bump 120 is greater than the height 143 of the trace 136. In this manner, trace 136 may extend in three-dimensions, including in an x-y plane parallel to the major surface 110 and in a z-direction orthogonal to the major surface 110.

Figure 1J:
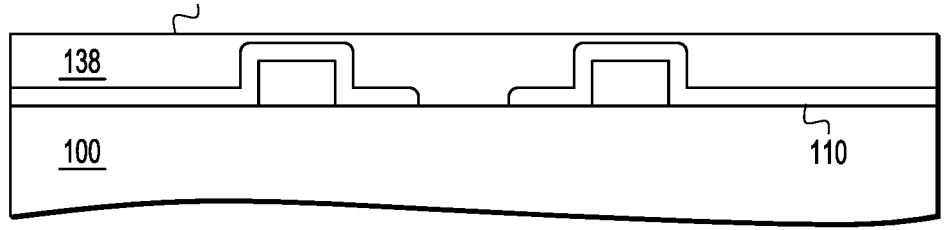

FIG. 1J shows dielectric material deposited over the side of the substrate 100 to form a layer 138, including over traces 136 and their underlying bumps 120. Layer 138 directly contacts the traces 136 and the exposed portions of major surface 110 to embed the traces 136 in dielectric material. In the embodiment shown, the dielectric material layer 138 has an outer surface 140 that covers the entirety of the traces 136, including over the upper trace portions 137 of the traces 136.

Figure 1K:
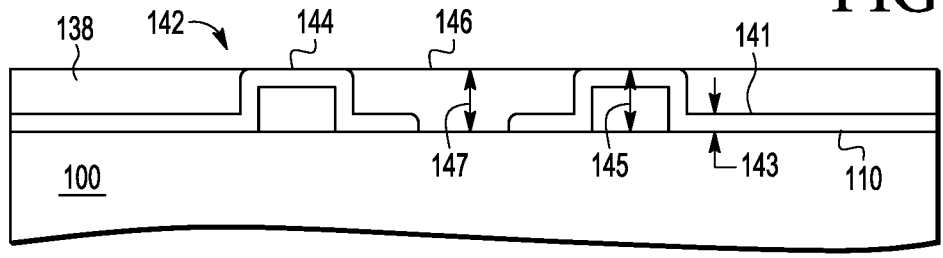

FIG. 1K shows the resulting embedded traces 136 after an etching step 142 is performed that removed an outermost portion of the dielectric material layer 138 to form a new outer surface 146. The upper trace portion 137 of each trace 136 has a top surface 144 exposed through the dielectric material layer 138 as a result of the etching step 142. In some embodiments, top surface 144 serves as a bondable surface or a bond pad, to which electronic components or external conductive structures may be attached. For example, a wire may be bonded or a solder ball may be joined to a bondable surface (like top surface 144) to form an external conductive structure. The combination of the dielectric bump 120 and plated trace 136 having exposed surface 144 may also be referred to as a capture pad 144. An underlying dielectric bump 120 provides mechanical support for such a bonded wire or solder ball, and is sufficient to withstand thermosonic stress or mechanical stress during attachment of the wire or solder ball. In some embodiments, the resulting substrate 100 shown in FIG. 1K may be a finished substrate to which one or more electronic components may be attached. The traces (like traces 136) are an example conductive structure that provides electrical connections, such as between a die or other electronic component attached to one set of bondable surfaces and external conductive structures attached to another set of bondable surfaces. Further, the bondable surfaces (like top surfaces 144) may be on both sides of the substrate, where electrical connections formed by conductive structures including the traces may pass through the substrate using one or more through vias, which may electrically connect electronic components and external conductive structures on one or both sides of the substrate.

In the embodiment shown in FIG. 1K, top surface 144 is coplanar with outer surface 146 of the remaining portion of dielectric material layer 138. The remaining portion of dielectric layer 138 has a height 147 measured from the major surface 110 to the outer surface 146. Height 145 is measured from the major surface 110 to the top surface 144. In the embodiment shown, height 147 is equal to height 145, where top surface 144 is coplanar with outer surface 146. In other embodiments (like that shown in FIG. 3J), top surface 144 extends beyond outer surface 146, where height 147 of layer 138 is shorter than height 145 to top surface 144 (which are respectively shown as height 347 and 345 in FIG. 3J). In such embodiments, lateral edges (e.g., outer corners and edges) of the upper trace portions 137 are also exposed through layer 138. In some embodiments, a top portion of the sidewall trace portions 135 may further be exposed through layer 138, which may provide improved wetting down the sidewall trace portions 135 for solder ball applications. As noted above, the lower trace portions 133 each have a height 143 that corresponds to the thickness of the resulting conductive material that forms the traces 136, where height 143 is measured from the major surface 110 to the top surface 141 of the lower trace portion 133. Additional plating or deposition steps may also be performed to coat the bondable surfaces (like top surfaces 144) with conductive material that improves wettability and adhesion for the external conductive structures, such as one or more electrically conductive metals, examples of which include but are not limited to nickel, gold, copper, aluminum, titanium, tungsten, chromium, palladium, or other suitable conductive metal or alloy composed of one or more suitable conductive metals.

Figure 2A:
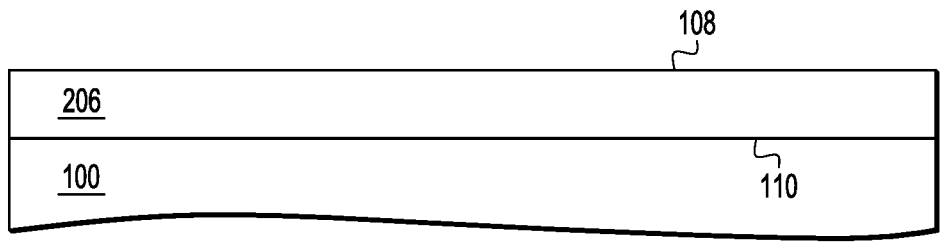
FIG. 2A-2D are block diagrams depicting example alternative embedded trace fabrication process steps, according to some embodiments of the present disclosure.

FIG. 2A-2D show cross-sectional views of some example alternative process steps in an example embedded trace fabrication process flow that includes forming a dielectric bump. FIG. 2A shows a photoimageable dielectric material deposited over major surface 110 to form layer 206 directly contacting major surface 110, which has an outer surface 108. Layer 206 serves as a base dielectric layer from which one or more dielectric bumps are formed, as discussed below. Examples of photoimageable dielectric material include but are not limited to photoimageable polyimide, photoimageable epoxy-based polymers, and the like.

Figure 2B:
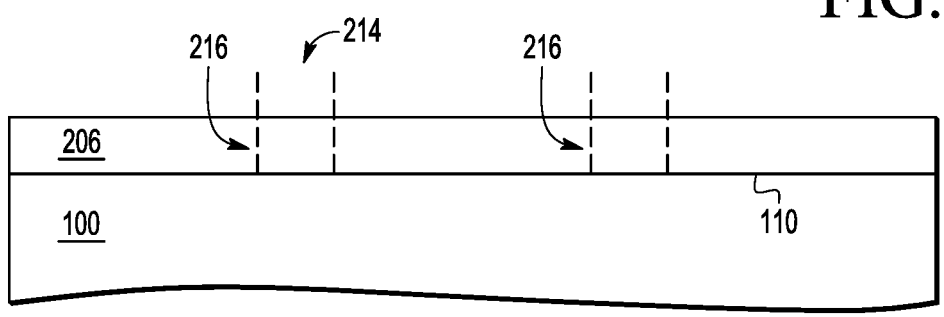

FIG. 2B shows a photolithographic step 214 of applying UV light through a photomask to the substrate 100. The photomask defines a number of areas 216 (shown in dashed outline), where each area 216 defines a location in which a dielectric bump is to be formed. UV light is applied to areas 216 through the photomask, which develops (or causes the photoresist material to undergo a photochemical reaction) areas 216 within photoimageable layer 206 into hardened dielectric material. The perimeter shape of the areas 216 in the photomask corresponds to a perimeter shape of the corresponding dielectric bump.

Figure 2C:
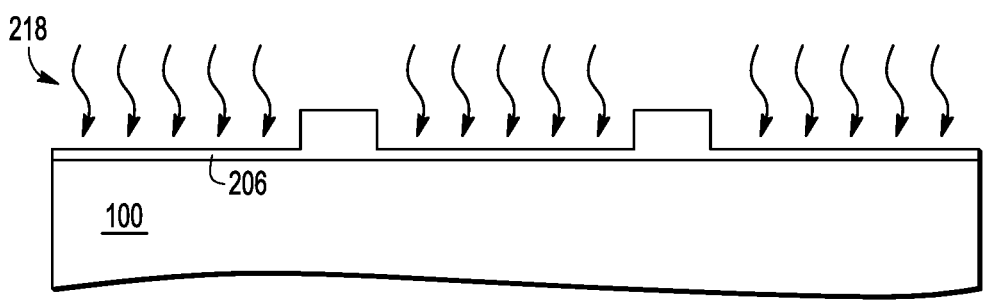

FIG. 2C shows an etching step 218 applied to the substrate 100 that removes the undeveloped portions of layer 206 outside of areas 216, without substantially removing the underlying dielectric material at the major surface 110 of the substrate 100. Etching step 218 may be performed using an etchant that selectively etches the undeveloped photoimageable dielectric material of layer 206, which may be different from the dielectric material at the major surface 110, or the etching step 218 may be limited to a predetermined amount of time to prevent substantial removal of the underlying dielectric material at the major surface 110.

Figure 2D:
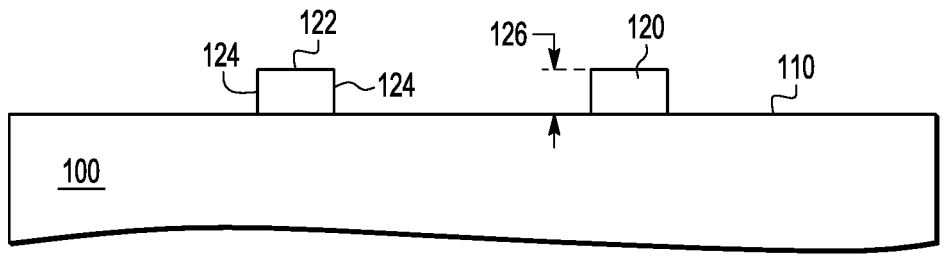

FIG. 2D shows the resulting dielectric bumps 120 that are formed after the etching step 218 has removed the undeveloped portions of layer 206. Each dielectric bump 120 has similar dimensions described above in connection with FIG.

1E. In some embodiments, the fabrication process may continue from FIG. 2D to FIG. 1F, discussed above.

Figure 3A:
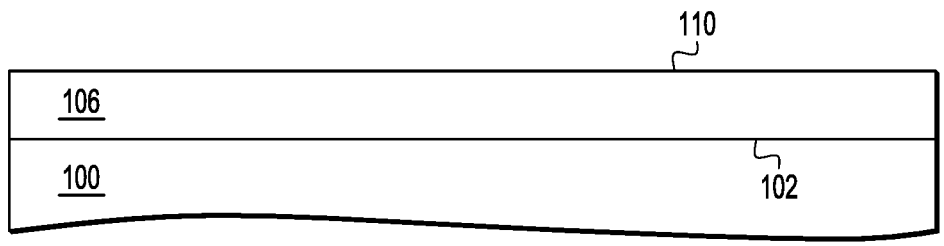
FIG. 3A-3J are block diagrams depicting another example embedded trace fabrication process flow, according to some embodiments of the present disclosure.

FIG. 3A-3J show cross-sectional views of various process steps in an example embedded trace fabrication process flow that includes forming a metal bump. FIG. 3A shows dielectric material deposited over the side of substrate 100 to form a layer 106 directly contacting a surface of the substrate 100 (such as top surface 102). In the embodiment shown, layer 106 may be one of a number of build-up layers formed on substrate 100 and forms a new outermost surface of the substrate 100, also referred to as a major surface 110 of the substrate 100. Layer 106 may cover an underlying metal surface such as an exposed portion of a metal surface of metal-cladded core board. In some embodiments, layer 106 may provide an insulating layer of dielectric material that covers any conductive material exposed at underlying surface 102 (e.g., layer 106 may directly contact an exposed portion of an underlying conductive trace (not shown) formed during previous steps of the build-up process).

Figure 3B:
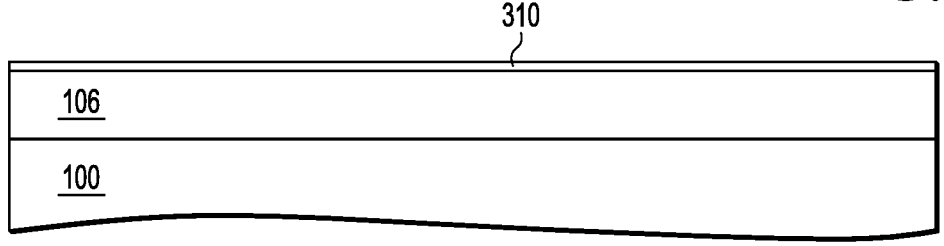
Figure 3C:
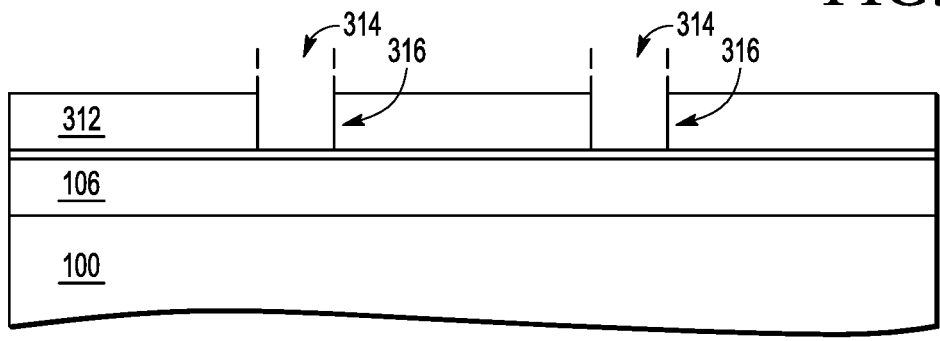

FIG. 3B shows a seed layer 130 deposited over the side of the substrate 100, including over and directly on major surface 110. FIG. 3C shows a layer of photoresist material deposited over the side of the substrate 100 and patterned into a photoresist mask 312 that directly contacts the seed layer 130. The patterned photoresist mask 312 includes a number of openings 314 that each define an area 316 in which a metal bump is to be formed. The location of each opening 314 defines the location of a corresponding metal bump, and the perimeter shape of each opening 314 corresponds to a perimeter of the corresponding metal bump.

Figure 3D:
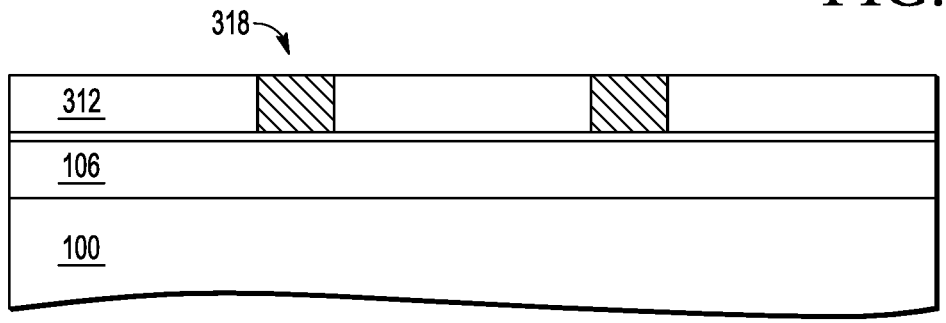
Figure 3E:
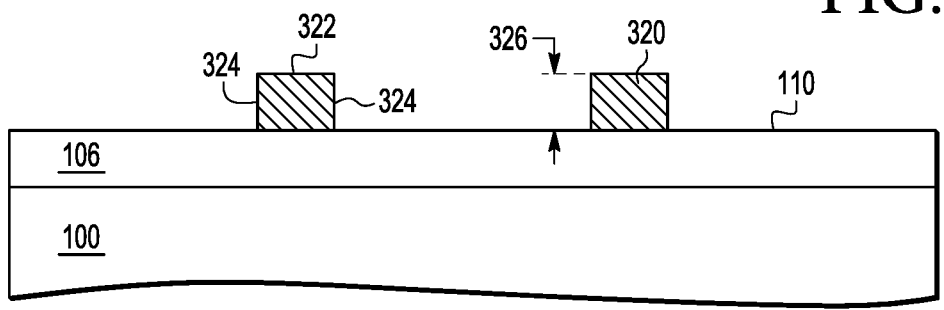

FIG. 3D shows a plating step 318 applied to the substrate 100 that plates exposed portions of the seed layer 130 within each opening 314 with conductive material. The portions of seed layer 130 that remain under photoresist mask 312 are not plated. FIG. 3E shows the resulting metal bumps 320 that are formed after the photoresist mask 312 and the underlying portions of the seed layer 130 are removed, such as by using one or more additional etching steps. Each metal bump 320 has a height 326 that substantially corresponds to the height of the plated conductive material measured from the underlying major surface 110, which is a combined thickness or height of the seed layer 130 and the conductive material plated onto the seed layer 130. Each metal bump 320 has a number of sidewalls 324 and a top (planar) surface 322.

Figure 3F:
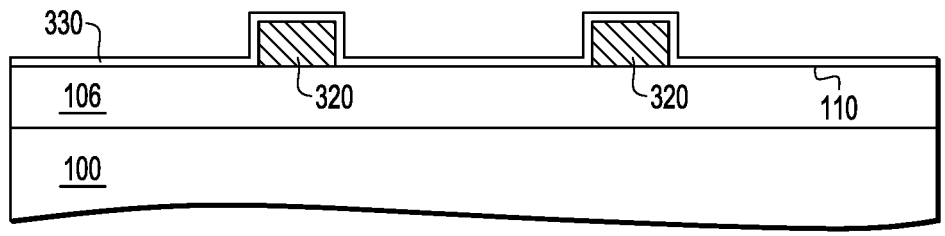

FIG. 3F shows a seed layer 330 deposited over the side of the substrate 100, including over the underlying major surface 110 and over each metal bump 320. Seed layer 130 makes direct contact with the underlying major surface 110, the sidewalls 324 of metal bump 320, and the top surface 322 of metal bump.

Figure 3G:
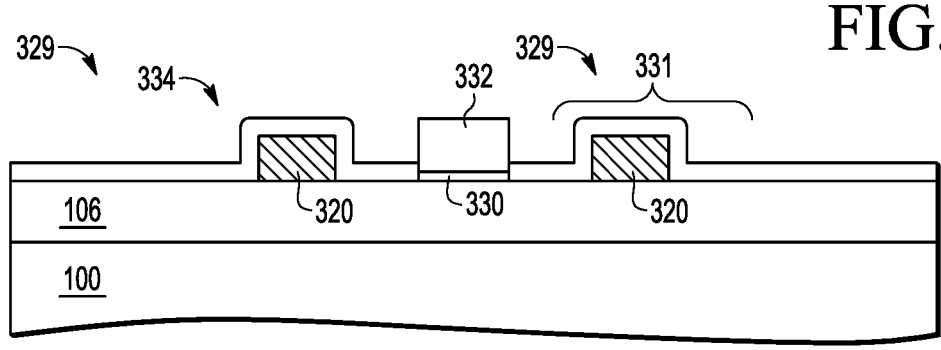

FIG. 3G shows a layer of photoresist material deposited over the side of substrate 100 and patterned into a photoresist mask 332 that directly contacts the seed layer 130. The photoresist mask 332 includes a number of openings 329 that each define an area 331 in which a trace is to be formed, where the area 331 includes the metal bump 320. The location and perimeter shape of each opening 329 defines the location and perimeter shape of a corresponding trace. FIG. 3G also shows a plating step 334 applied to the substrate 100 that plates exposed portions of the seed layer 130 within each opening 329. The portions of seed layer 130 that remain under photoresist mask 332 are not plated.

Figure 3H:
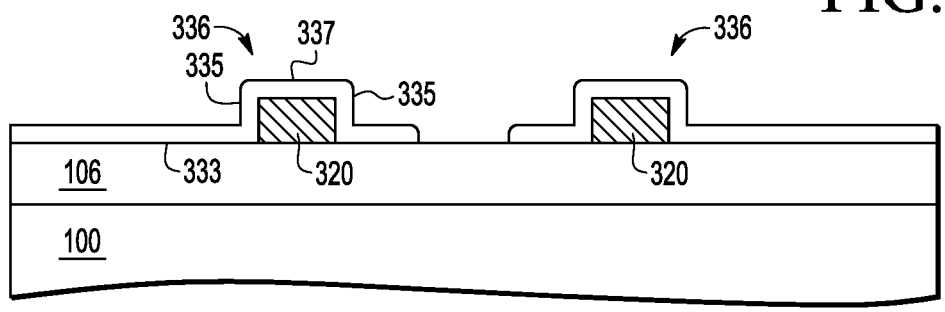

FIG. 3H shows the resulting traces 336 after the portions of the photoresist mask 332 and the underlying remaining portions of the seed layer 130 are removed, such as by using one or more additional etching steps. Each trace 336 includes a lower trace portion 333 that directly contacts the major surface 110, a sidewall trace portion 335 that directly contacts at least one sidewall of the metal bump 320, and an upper trace portion 337 that directly contacts the top surface 322 of the metal bump 320.

Figure 3I:
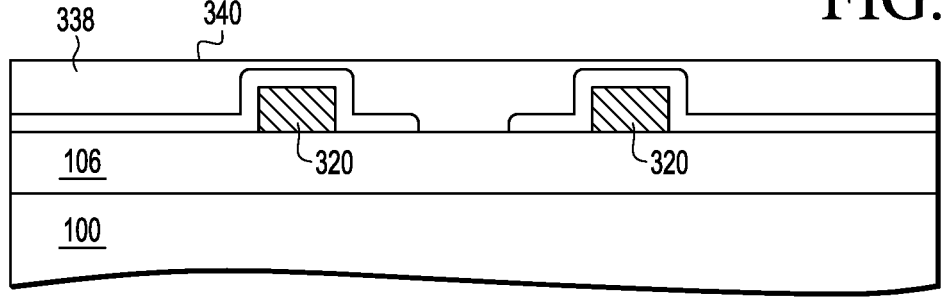

FIG. 3I shows dielectric material deposited over the side of the substrate 100 to form a layer 338, including over traces 336 and their underlying bumps 320. Layer 338 directly contacts the traces 336 and the exposed portions of major surface 110 to embed the traces 336 in dielectric material. In the embodiment shown, layer 338 has an outer surface 140 that covers the entirety of the traces 136, including over the upper trace portions 337.

Figure 3J:
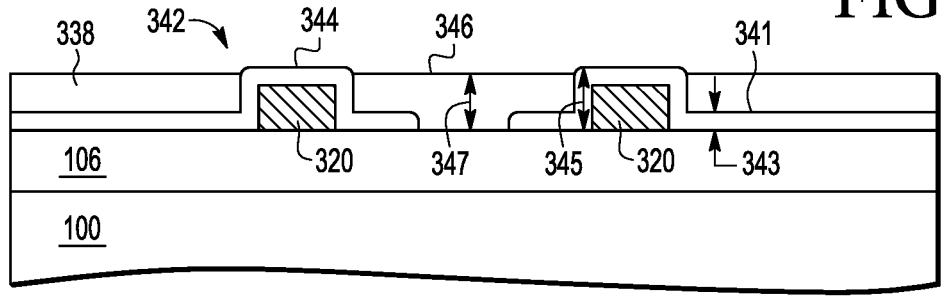

FIG. 3J shows the resulting embedded traces 336 after an etching step 342 is performed that removed an outermost portion of layer 338 to form a new outer surface 346. The upper trace portion 337 of each trace 136 has a top surface 344 exposed through the layer 338 as a result of the etching step 342. In some embodiments, top surface 344 serves as a bondable surface or a bond pad. The combination of the metal bump 320 and plated trace 336 having exposed surface 344 may also be referred to as a capture pad 344. In some embodiments, a metal bump 320 may provide additional mechanical support for withstanding stresses involved with bonding a wire or attaching a solder ball to the top surface of the upper trace portion, as compared with a dielectric bump 120. In the embodiment shown, top surface 344 is exposed through and extends beyond outer surface 346, where the remaining portion of layer 338 has a height 347 measured from the major surface 110 to the outer surface 346. Height 347 is less than height 345, which is measured from the major surface 110 to the top surface 344 of the upper trace portion 337. As also shown, a lateral edge of the upper trace portions 337 are exposed through layer 138. In some embodiments, a top portion of the sidewall trace portions 335 may further be exposed for improved wetting.

Each trace 336 generally has a consistent thickness shown as height 343 that corresponds to the combined thickness or height of the seed layer 330 and the conductive material plated onto the seed layer 130. Height 143 is measured from major surface 110 to a top surface 341 of the lower trace portion 333. In some embodiments, the height 326 of the metal bump 320 is greater than the height 343 of the trace 336. In this manner, trace 336 may extend in three-dimensions, including in an x-y plane parallel to the major surface 110 and in a z-direction orthogonal to the major surface 110.

Figure 4A:
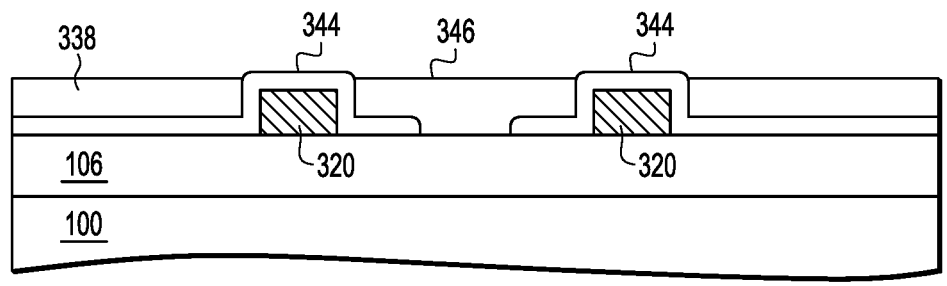
FIG. 4A-4E are block diagrams depicting an example stacked via fabrication process flow, according to some embodiments of the present disclosure.

FIG. 4A-4E shows cross-sectional views of various process steps in an example stacked via fabrication process flow. In the embodiment shown, FIG. 4A continues from the embedded traces shown in FIG. 3J. In some embodiments, an underlying metal bump 320 may provide improved mechanical support for withstanding the stresses involved with forming the stacked via above the metal bump 320, as compared with the dielectric bump 120. While FIG. 4A shows embedded traces having top surfaces 344 that extend beyond outer surface 346 of layer 338, embedded traces having top surfaces 344 coplanar with outer surface 346 of layer 338 may also be used.

Figure 4B:
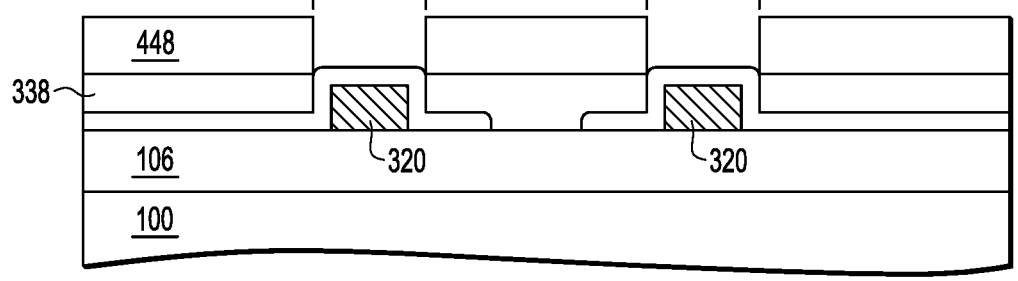

FIG. 4B shows a layer of photoresist material deposited over the side of the substrate 100 and patterned into a photoresist mask 448 that includes a number of openings 450 aligned with the upper trace portions 334. Top surfaces 344 are exposed within the openings 450 of photoresist mask 448.

Figure 4C:
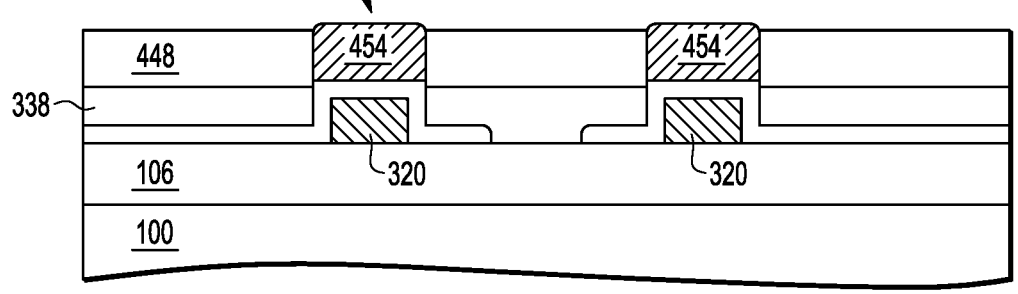

FIG. 4C shows a plating step 452 applied to the substrate 100 that plates the exposed top surfaces 344 with conductive material within each opening 450, which forms a metal-filled via 454 in direct contact with top surface 344. Metal-filled via 454 may also be referred to as being stacked on top of the upper trace portion 337 and metal bump 320.

Figure 4D:
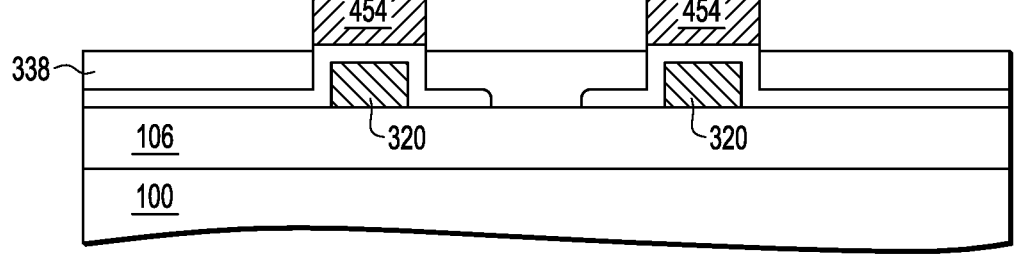
Figure 4E:
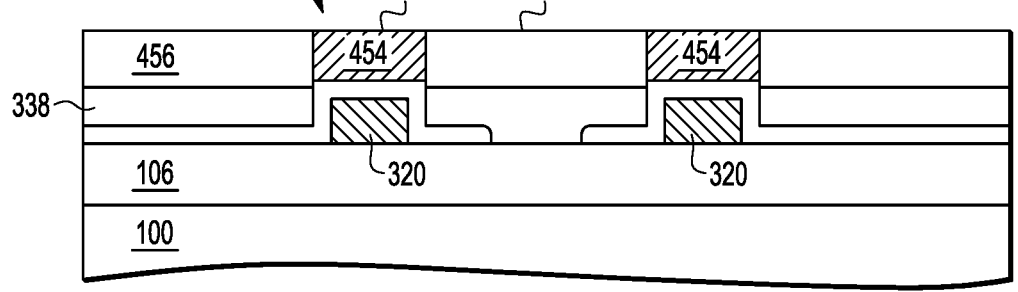

FIG. 4D shows the resulting metal-filled vias 454 after the photoresist mask 448 is removed. FIG. 4E shows dielectric material deposited over the side of the substrate 100 to form a layer 456, which directly contacts the outer surface 346 of the underlying dielectric layer 338 and the sidewalls of the metal-filled vias 454. In some embodiments, layer 456 may cover a top surface 460 of the metal-filled vias 454. In such embodiments, an etching step may be applied to remove an outermost portion of the layer 456 to form a new surface 462 and expose the top surfaces 460 of the metal-filled vias 454 through the layer 456. In the embodiment shown, top surface 460 is coplanar with outer surface 462 of layer 456. In other embodiments, top surface 460 may not be coplanar, such as extending beyond outer surface 462.

The steps shown in FIG. 4A-4E may be repeated several times to form multiple metal-filled vias 454 stacked on top of one another. For example, the top surfaces 460 of metal-filled vias 454 serve as underlying metal surfaces similar to top surfaces 344 shown in FIG. 4A. A photoresist mask may then be formed over the substrate 100 shown in FIG. 4E, with openings 450 aligned to the top surfaces 460 for plating an additional metal-filled via within each opening 450. The photoresist mask may then be removed and another dielectric layer deposited to surround the additional metal-filled vias.

Since the opening in the photoresist mask is aligned with an outer perimeter of the underlying metal surface within an acceptable tolerance (e.g., +/−12 microns), the alignment of each metal-filled via stacked on top of one another is also within an acceptable tolerance (e.g., +/−10 microns). For example, each metal-filled via has a substantially similar lateral width (e.g., 80 microns), where the alignment tolerance allows a number of stacked metal-filled vias to have a smoother vertical profile similar to a column profile, which provides a more compact lateral footprint, as compared to a stack of known microvias. A known microvia has a "lip" at a top portion of the microvia that extends away from the sidewalls of the microvia, where the sidewalls slope inward towards the bottom portion of the microvia, due to the manner in which it is fabricated. The tolerance of such laser drilled stacked microvias is larger (e.g., +/−20 microns) than the acceptable tolerance provided by the present disclosure The smoother column profile of the stacked metal-filled vias of the present disclosure can further be seen in FIG. 5A-5J, discussed below. It is also noted that the metal bumps 320 may each have a substantially similar lateral width (e.g., 50 microns), and the plated traces 336 each have a substantially similar consistent thickness (e.g., 15 microns) that adds a similar amount to the lateral width of the resulting capture pad 344 (e.g., 80 microns), which may be substantially similar to the lateral width of a metal-filled via.

Figure 5A:
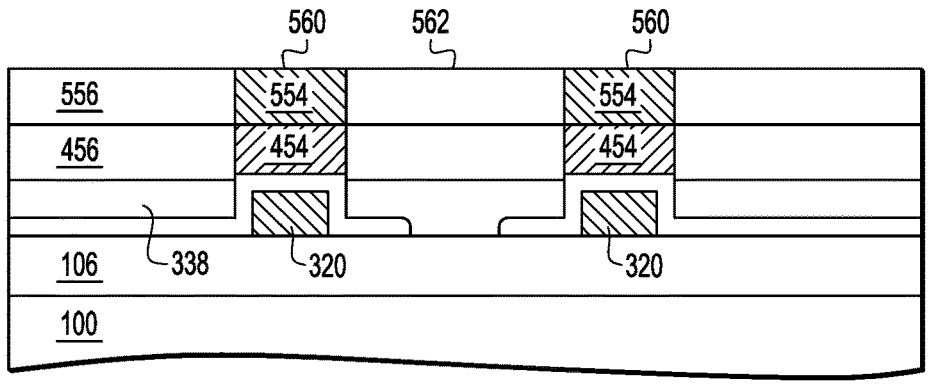
FIG. 5A-5J are block diagrams depicting an additional example embedded trace fabrication process flow, according to some embodiments of the present disclosure.

FIG. 5A-5J show cross-sectional views of various process steps in another example embedded trace fabrication process flow, which may be performed after the stacked via fabrication process flow shown in FIG. 4A-4D. FIG. 5A shows second metal-filled vias 554 stacked on top of metal-filled vias 454, which are surrounded by dielectric layer 556 having an outer surface 562. Metal-filled vias 554 each have a top surface 560 exposed through layer 556. Surfaces 560 and 562 may be coplanar or may not be coplanar, for similar reasons discussed above.

Figure 5B:
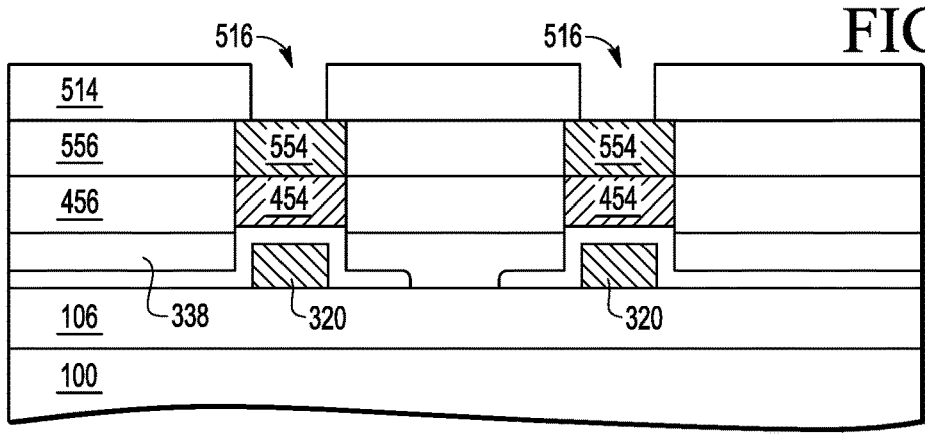

FIG. 5B shows a layer of photoresist material deposited over the side of the substrate 100 and patterned into a photoresist mask 514 that includes a number of openings 516 aligned with the top surfaces 560 of underlying metal-filled vias 554. In the embodiment shown, at least a portion of top surfaces 560 are exposed within the openings 516 of photoresist mask 514. In some embodiments, openings 516 may be large enough to form a suitable sized metal bump, as opposed to a larger opening that may form a suitable sized metal-filled via. In some embodiments, a resulting metal bump may be smaller than a resulting metal-filled via since the metal bump will be plated over to form a trace.

Figure 5C:
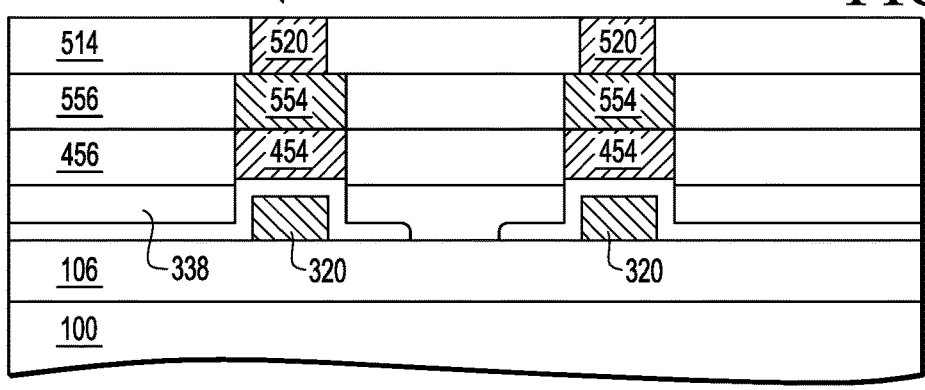

FIG. 5C shows a plating step 518 applied to the substrate 100 that plates the exposed top surfaces 560 with conductive material within each opening 516, which forms a metal bump 520 in direct contact with top surface 344. Metal bump 520 may also be referred to as being stacked on top of the underlying metal-filled via 554.

Figure 5D:
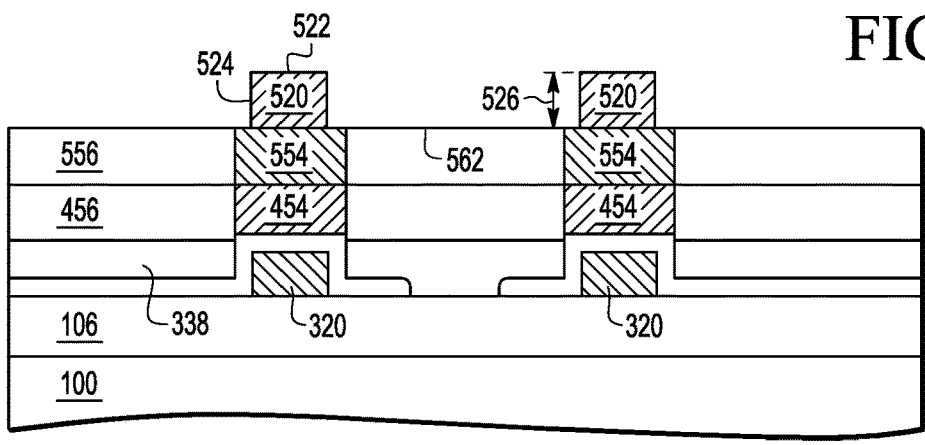
Figure 5E:
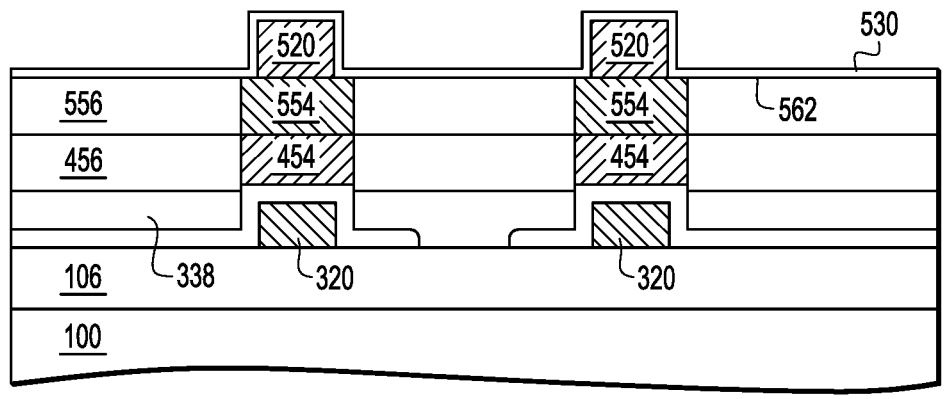

FIG. 5D shows the resulting metal bumps 520 after the photoresist mask 514 is removed, where each bump 520 has a height 526 measured from the underlying surface 560, sidewalls 524, and a top surface 522. FIG. 5E shows a seed layer 530 deposited over the side of the substrate 100, making direct contact with the underlying dielectric surface 562, the sidewalls of metal bumps 520, and the top surfaces 522 of metal bumps 520.

Figure 5F:
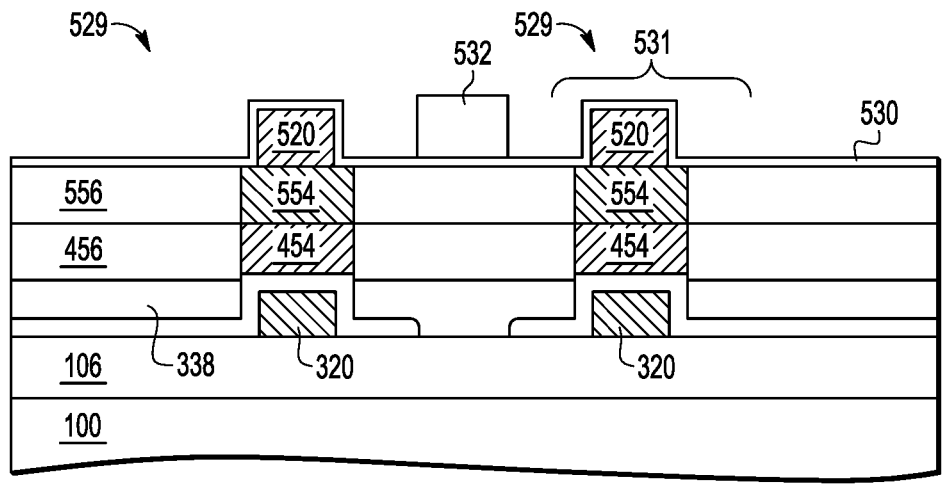
Figure 5G:
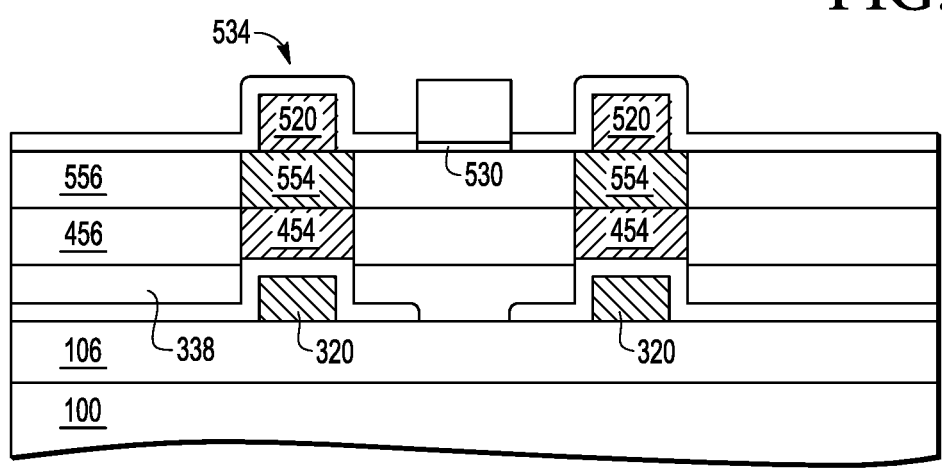

FIG. 5F shows a layer of photoresist material deposited over the side of the substrate 100 and patterned into a photoresist mask 532 that includes a number of openings 529 that each define an area 531 in which a trace is to be formed, where the area 531 includes metal bump 520. FIG. 5G shows a plating step 534 applied to the substrate 100 that plates exposed portions of the seed layer 530 within each opening 529.

Figure 5H:
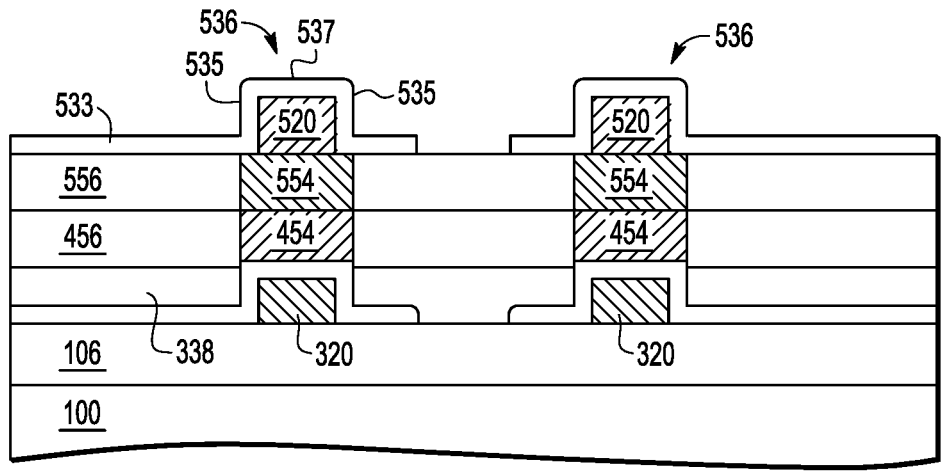

FIG. 5H shows the resulting traces 536 after the portions of the photoresist mask 532 and the underlying remaining portions of the seed layer 530 are removed. Each trace 536 includes a lower trace portion 533, a sidewall trace portion 535 that directly contacts at least one sidewall of the metal bump 520, and an upper trace portion 537 that directly contacts the top surface 522 of the metal bump 520.

Figure 5I:
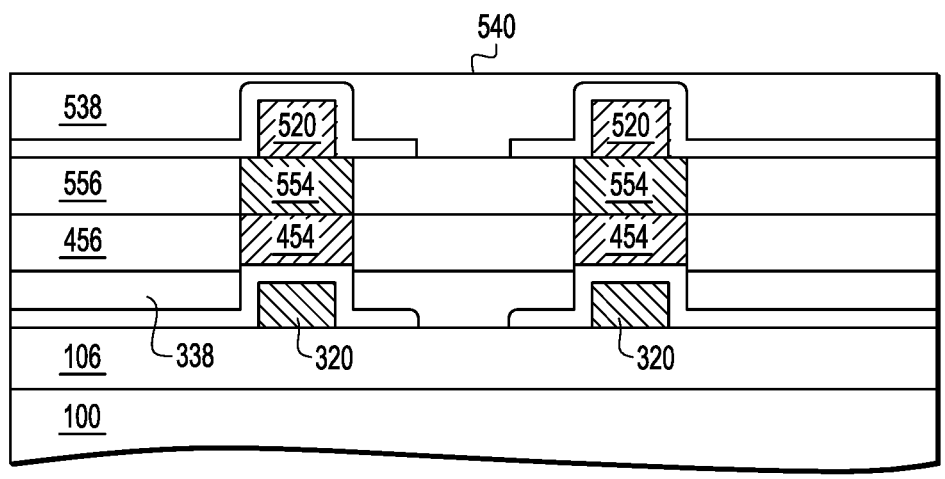
Figure 5J:
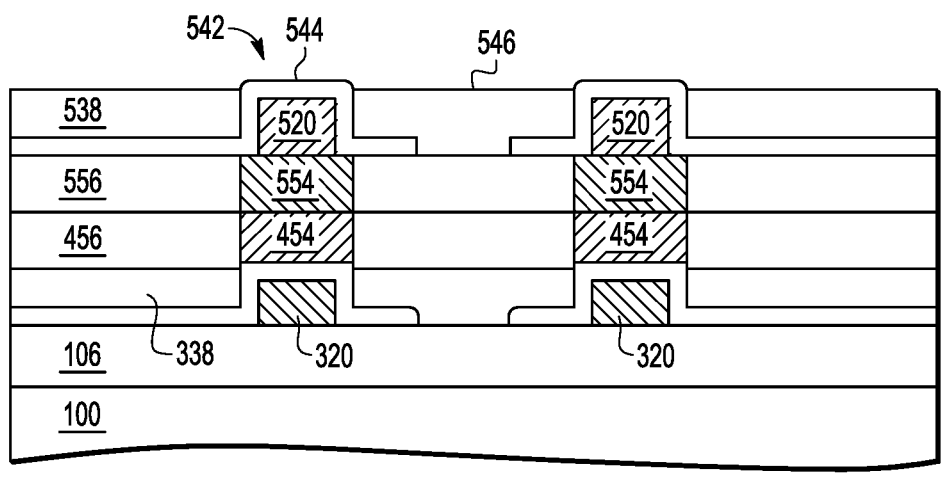

FIG. 5I shows dielectric material deposited over the side of substrate 100 to form layer 538, which embeds traces 536. In the embodiment shown, layer 538 has an outer surface 540 that covers traces 136. FIG. 5J shows the resulting embedded traces 536 after an etching step 542 is performed that removed an outermost portion of the layer 538 to form a new outer surface 546 and expose top surfaces 544 of the upper trace portions 537 through layer 538. In the embodiment shown, top surface 544 is coplanar with outer surface 546 of layer 538. In other embodiments, top surface 544 may not be coplanar, such as extending beyond outer surface 546.

Figure 6:
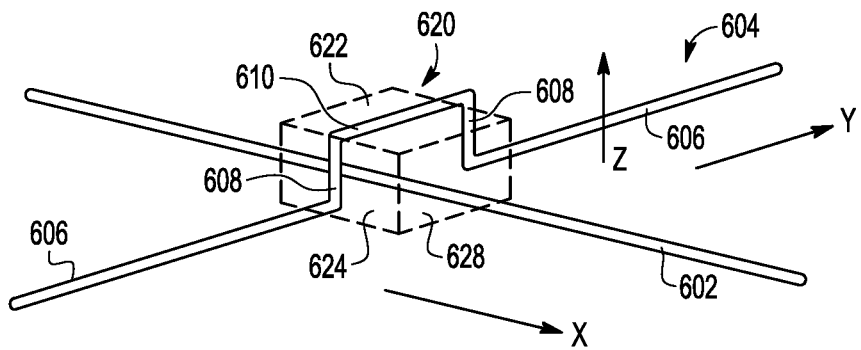
FIGS. 6, 7A-7D, and 8A-8E are block diagrams depicting an example cross-directional embedded trace fabrication process flow, according to some embodiments of the present disclosure.

FIG. 6 shows a perspective view of embedded traces extending in perpendicular directions on a side of a substrate. Trace 602 extends in a first direction, or x-direction, and trace 604 extends in a second direction, or y-direction, perpendicular to the first direction. A portion of trace 604 is formed over a dielectric bump 620, which raises the trace 604 in a third orthogonal direction, or z-direction. The raised portion of the trace 604 is separate from and crosses over trace 602 without contacting trace 602, with the dielectric bump 620 serving as insulation between traces 602 and 604. Trace 604 includes one or more lower trace portions 606 directly contacting an underlying dielectric surface (shown extending out on either side of bump 620), one or more sidewall trace portions 608 directly contacting sidewalls 624 of the dielectric bump 620 (shown on opposing sidewalls 624 of the bump 620), and an upper trace portion 610 directly contacting the top surface 622 of the bump 620. Trace 602, also referred to as a cross-directional trace, is shown extending through opposing sidewalls 628 of the bump 620, which are perpendicular to the sidewalls 624 that have sidewall trace portions 608 of trace 604. Although not shown for simplicity's sake, both traces 602 and 604 are covered by dielectric material.

FIGS. 7A-7D and 8A-8E show cross-sectional views of various process steps in an example cross-directional embedded trace fabrication process flow, with FIG. 7A-7D directed to a flat trace under a dielectric bump (like trace 602) and FIG. 8A-8E directed to a raised trace over a dielectric bump (like trace 606).

Figure 7A:
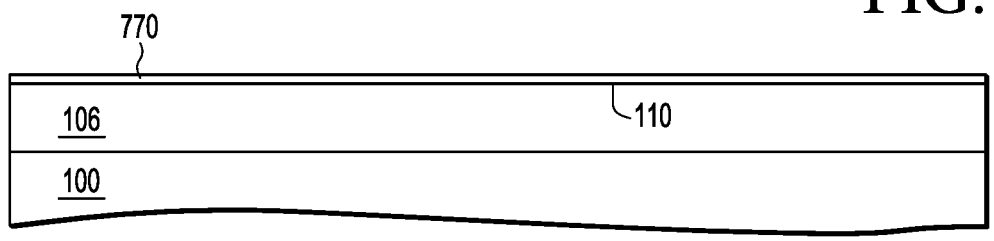
Figure 7B:
Figure 7C:
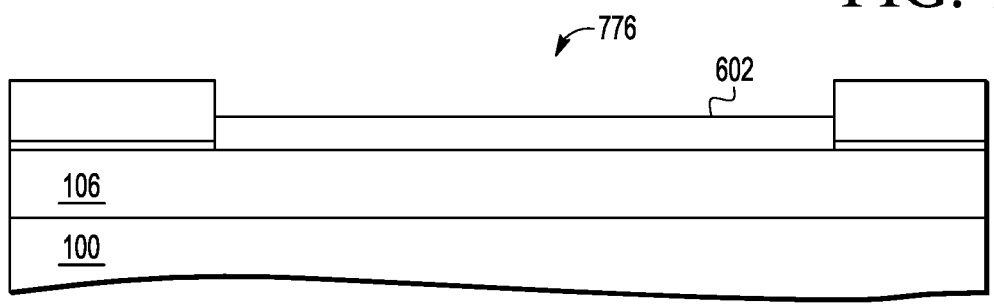
Figure 7D:
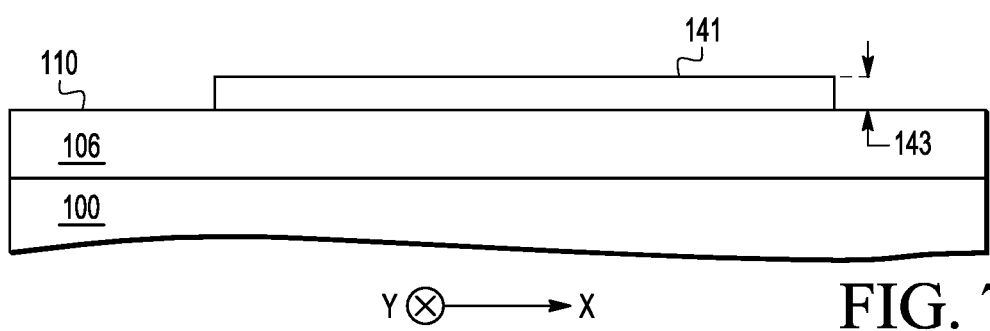

FIG. 7A shows a seed layer 770 deposited over the side of substrate 100, where seed layer 770 is in direct contact with major surface 110 of dielectric layer 106 of substrate 100. FIG. 7B shows a layer of photoresist material deposited over the side of substrate 100 and patterned into a photoresist mask 772 that directly contacts the seed layer 770. The patterned photoresist mask 772 includes at least one opening 774 in which a flat trace is to be formed. FIG. 7C shows a plating step 776 that plates exposed portions of the seed layer 770 within opening 774 to form a flat trace, or a trace (or portion of a trace) that remains in direct contact with underlying major surface 110. FIG. 7D shows the resulting trace 602 after photoresist mask 772 and any underlying portions of seed layer 770 have been removed. Trace 602 has a consistent thickness shown as height 143 measured from major surface 110 to a top surface 141 of the trace.

Figure 8A:
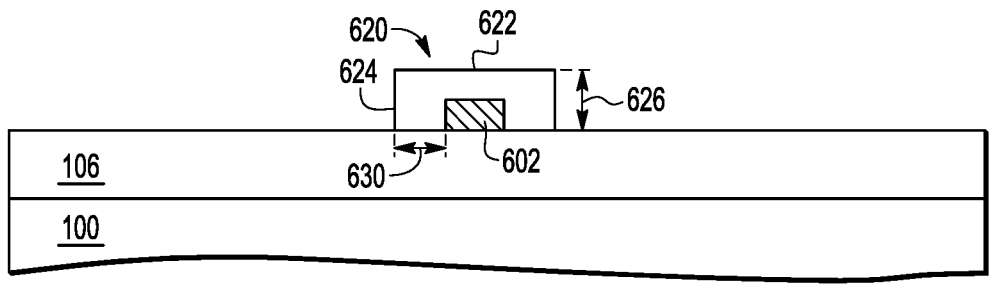
Figure 8B:
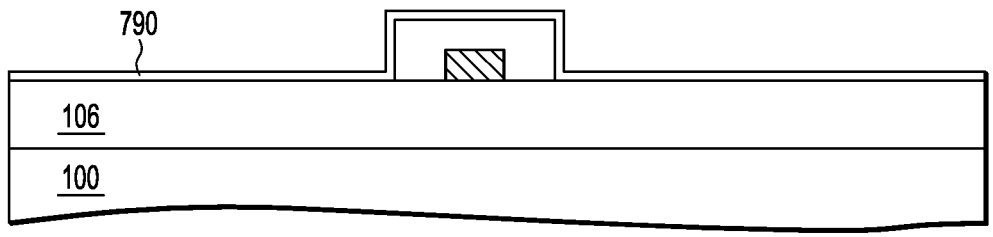
Figure 8C:
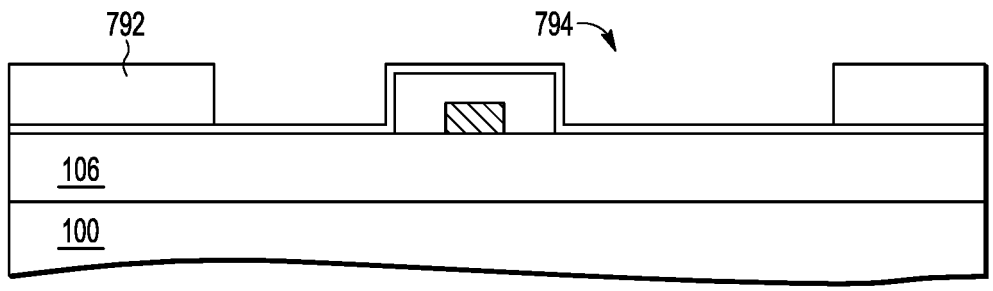
Figure 8D:
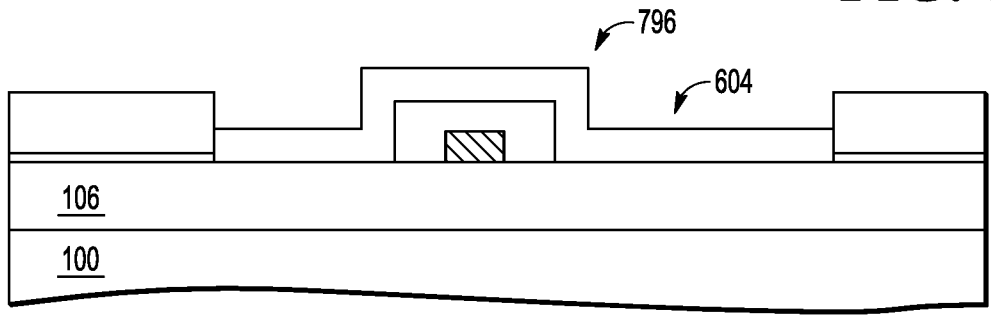
Figure 8E:
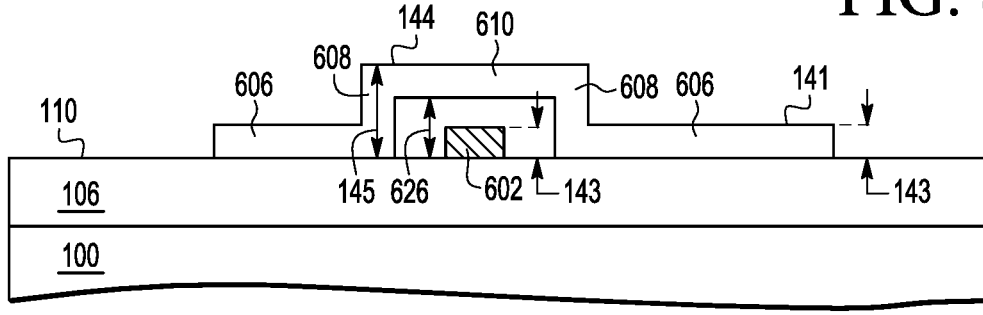

FIG. 8A continues from FIG. 7D, where a dielectric bump 620 is formed over a portion of flat trace 602. Dielectric bump 620 may be formed using various steps described above. Dielectric bump 620 extends by a width 630 on either side of the trace 602 to provide adequate insulation. FIG. 8B shows a seed layer 790 deposited over the side of the substrate 100, including over and directly on major surface 110, the sidewalls 624 of the bump 620, and the top surface 622 of the bump 620. FIG. 8C shows a layer of photoresist material deposited over the side of substrate 100 and patterned into a photoresist mask 792 that directly contacts the seed layer 790. The patterned photoresist mask 792 includes at least one opening 794 in which a raised trace is to be formed over the bump 620. FIG. 8D shows a plating step 796 that plates exposed portions of the seed layer 790 to form a raised trace, or a trace (or portion of a trace) that is in direct contact with at least one sidewall 624 and the top surface 622 of a bump 620. FIG. 8E shows the resulting trace 604 after photoresist mask 792 and any underlying portions of seed layer 790 have been removed. Trace 604 has one or more lower trace portions 606, one or more sidewall trace portions 608, and an upper trace portion 610. Trace 604 has a consistent thickness shown as height 143 of lower trace portion 606, which is measured from major surface 110 to a top surface 141, which is substantially equal to height 143 of trace 602. In the embodiment shown, height 626 of dielectric bump 620 is greater than height 143. Although not shown, a layer of dielectric material is then deposited over the traces 602 and 604 to embed them in dielectric material.

It is noted that there may be other variations on the embodiments. For example, in some embodiments, the substrate 100 shown in FIG. 5J may have flat embedded traces (like trace 602 shown in FIG. 7D) formed under layer 538 to provide routing under layer 538, instead of the traces 536 that provide a bondable surface for an external conductive structure as shown. In another example, the top surface 460 of the metal-filled via 454 shown in FIG. 4E or the top surface 560 of the topmost metal-filled via 554 shown in FIG. 5A may provide a bondable surface for an external conductive structure, rather than forming another embedded trace or another metal-filled via on top.

The substrate described herein may be used to support a semiconductor die or integrated circuit die, which may include any semiconductor material or combinations of materials, such as gallium arsenide, silicon germanium, silicon-on-insulator (SOI), silicon, monocrystalline silicon, the like, and combinations of the above.

By now it should be appreciated that there has been provided methods for fabricating a substrate having one or more embedded traces, which include a trace formed over a dielectric bump or a metal bump formed on a major surface of the substrate. The trace extends along the major surface, along at least one sidewall of the bump, and along a top surface of the bump, where a top surface of the portion of the trace located on top of the bump is exposed through the dielectric material and provides a bondable surface.

In one embodiment of the present disclosure, a method for fabricating one or more embedded traces is provided, which includes: forming a bump on a first major surface of a substrate, the bump having a height measured from the first major surface to a top surface of the bump; forming a trace including: a lower trace portion that directly contacts the first major surface, a sidewall trace portion that directly contacts at least one sidewall of the bump, and an upper trace portion that directly contacts the top surface of the bump; depositing a blanket dielectric layer over the trace; and etching away a top portion of the blanket dielectric layer to expose a top surface of the upper trace portion.

One aspect of the above embodiment provides that the top surface of the upper trace portion is coplanar with a top surface of a remaining portion of the blanket dielectric layer.

Another aspect of the above embodiment provides that the top surface of the upper trace portion extends beyond a top surface of a remaining portion of the blanket dielectric layer.

Another aspect of the above embodiment provides that the first major surface of the substrate includes dielectric material.

Another aspect of the above embodiment provides that the substrate includes a metal-cladded dielectric core board covered by dielectric material.

Another aspect of the above embodiment provides that the bump includes a dielectric bump.

Another aspect of the above embodiment provides that the bump includes a metal bump.

A further aspect of the above embodiment provides that the forming the bump includes: depositing a base dielectric layer over and directly contacting the first major surface of the substrate; depositing and patterning a photoresist mask on the base dielectric layer to define an area in which the dielectric bump is to be formed; removing portions of the base dielectric layer outside of the photoresist mask to form the dielectric bump within the area; and removing the photoresist mask.

Another further aspect of the above embodiment provides that the forming the bump includes: depositing a base dielectric layer over and directly contacting the first major surface of the substrate, wherein the base dielectric layer is photoimageable; photoimaging portions of the base dielectric layer to define an area in which the dielectric bump is to be formed; and removing non-photoimaged portions of the base dielectric layer to form the dielectric bump within the area.

Another further aspect of the above embodiment provides that the forming the bump includes: depositing a blanket seed layer over and directly contacting the first major surface of the substrate; depositing and patterning a photoresist mask on the blanket seed layer to define an area in which the metal bump is to be formed; plating exposed portions of the blanket seed layer to form the metal bump within the area; and removing the photoresist mask and any portions of the blanket seed layer underlying the photoresist mask.

Another aspect of the above embodiment provides that the forming the trace includes: depositing a blanket seed layer over the first major surface of the substrate, including over the bump, wherein the blanket seed layer directly contacts the first major surface, at least one sidewall of the bump, and the top surface of the bump; depositing and patterning a photoresist mask on the blanket seed layer to define an area, which includes the bump, in which the trace is to be formed; plating exposed portions of the blanket seed layer to form the trace within the area; and removing the photoresist mask and any portions of the blanket seed layer underlying the photoresist mask.

Another aspect of the above embodiment further includes: forming a column of one or more metal-filled vias above the bump, wherein the bump includes a metal bump.

A further aspect of the above embodiment provides that each of the one or more metal-filled vias is formed by: depositing and patterning a photoresist mask on a top surface of the substrate, the photoresist mask having an opening aligned with an underlying metal surface; plating the underlying metal surface to form a metal-filled via within the opening; removing the photoresist mask; depositing a second blanket dielectric layer over the metal-filled via; and etching away a top portion of the second blanket dielectric layer to expose a top surface of the metal-filled via.

A still further aspect of the above embodiment provides that the underlying metal surface is one of a group including the top surface of the upper trace portion and a top surface of an underlying metal-filled via.

Another further aspect of the above embodiment further includes: forming a second trace in contact with a top surface of a top metal-filled via of the column of one or more vias, the top surface exposed in a top dielectric layer of the substrate.

Another further aspect of the above embodiment further includes: forming a second metal bump in contact with a top surface of a top metal-filled via of the column of one or more vias, the top surface exposed in a top dielectric layer of the substrate.

A still further aspect of the above embodiment further includes: forming a second trace over and in contact with the second metal bump, wherein the second trace includes: a lower trace portion that directly contacts the top dielectric layer, a sidewall trace portion that directly contacts at least one sidewall of the second metal bump, and an upper trace portion that directly contacts the top surface of the second metal bump.

Another still further aspect of the above embodiment further includes: depositing a second blanket dielectric layer over the second trace; and etching away a top portion of the second blanket dielectric layer to expose a top surface of the upper trace portion to form a bondable surface.

Another aspect of the above embodiment further includes: forming a cross-directional trace directly on the first major surface prior to the forming the bump, wherein the cross-directional trace extends in a first direction, the trace including the lower, sidewall, and upper trace portions extends in a second direction perpendicular to the first direction, and the bump includes a dielectric bump formed over and directly contacting a top surface and sidewalls of the cross-directional trace.

A further aspect of the above embodiment provides that the cross-directional trace has a first height measured from the first major surface to the top surface of the cross-directional trace, the dielectric bump has a second height measured from the first major surface to a top surface of the dielectric bump, the second height greater than the first height, and the upper trace portion directly contacts the top surface of the dielectric bump and has a third height measured from the first major surface to the top surface of the upper trace portion, the third height greater than the second height.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected process abnormalities that may occur during fabrication process steps, which are not significant for the stated purpose or value.

Although the invention is described herein with reference to specific embodiments, various modifications and changes can be made without departing from the scope of the present invention as set forth in the claims below. For example, additional or fewer embedded traces may be implemented in FIG. 1K. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for fabricating one or more embedded traces, the method comprising:
   forming a bump on a first major surface of a substrate, the bump having a height measured from the first major surface to a top surface of the bump;
   forming a trace comprising:
      a lower trace portion that directly contacts the first major surface,
      a sidewall trace portion that directly contacts at least one sidewall of the bump, and
      an upper trace portion that directly contacts the top surface of the bump;
   depositing a blanket dielectric layer over the trace; and
   etching away a top portion of the blanket dielectric layer to expose a top surface of the upper trace portion.

2. The method of claim 1, wherein the top surface of the upper trace portion is coplanar with a top surface of a remaining portion of the blanket dielectric layer.

3. The method of claim 1, wherein the top surface of the upper trace portion extends beyond a top surface of a remaining portion of the blanket dielectric layer.

4. The method of claim 1, wherein the first major surface of the substrate comprises dielectric material.

5. The method of claim 1, wherein the substrate comprises a metal-cladded dielectric core board covered by dielectric material.

6. The method of claim 1, wherein the bump comprises a dielectric bump.

7. The method of claim 1, wherein the bump comprises a metal bump.

8. The method of claim 6, wherein the forming the bump comprises:
   depositing a base dielectric layer over and directly contacting the first major surface of the substrate;
   depositing and patterning a photoresist mask on the base dielectric layer to define an area in which the dielectric bump is to be formed;
   removing portions of the base dielectric layer outside of the photoresist mask to form the dielectric bump within the area; and
   removing the photoresist mask.

9. The method of claim 6, wherein the forming the bump comprises:
   depositing a base dielectric layer over and directly contacting the first major surface of the substrate, wherein the base dielectric layer is photoimageable;
   photoimaging portions of the base dielectric layer to define an area in which the dielectric bump is to be formed; and
   removing non-photoimaged portions of the base dielectric layer to form the dielectric bump within the area.

10. The method of claim 7, wherein the forming the bump comprises:
    depositing a blanket seed layer over and directly contacting the first major surface of the substrate;
    depositing and patterning a photoresist mask on the blanket seed layer to define an area in which the metal bump is to be formed;
    plating exposed portions of the blanket seed layer to form the metal bump within the area; and
    removing the photoresist mask and any portions of the blanket seed layer underlying the photoresist mask.

11. The method of claim 1, wherein the forming the trace comprises:
    depositing a blanket seed layer over the first major surface of the substrate, including over the bump, wherein the blanket seed layer directly contacts the first major surface, at least one sidewall of the bump, and the top surface of the bump;
    depositing and patterning a photoresist mask on the blanket seed layer to define an area, which includes the bump, in which the trace is to be formed;
    plating exposed portions of the blanket seed layer to form the trace within the area; and
    removing the photoresist mask and any portions of the blanket seed layer underlying the photoresist mask.

12. The method of claim 1, further comprising:
    forming a column of one or more metal-filled vias above the bump, wherein the bump comprises a metal bump.

13. The method of claim 12, wherein each of the one or more metal-filled vias is formed by:
    depositing and patterning a photoresist mask on a top surface of the substrate, the photoresist mask having an opening aligned with an underlying metal surface;
    plating the underlying metal surface to form a metal-filled via within the opening;
    removing the photoresist mask;
    depositing a second blanket dielectric layer over the metal-filled via; and
    etching away a top portion of the second blanket dielectric layer to expose a top surface of the metal-filled via.

14. The method of claim 13, wherein the underlying metal surface is one of a group comprising the top surface of the upper trace portion and a top surface of an underlying metal-filled via.

15. The method of claim 12, further comprising:
    forming a second trace in contact with a top surface of a top metal-filled via of the column of one or more vias, the top surface exposed in a top dielectric layer of the substrate.

16. The method of claim 12, further comprising:
    forming a second metal bump in contact with a top surface of a top metal-filled via of the column of one or more vias, the top surface exposed in a top dielectric layer of the substrate.

17. The method of claim 16, further comprising:
    forming a second trace over and in contact with the second metal bump, wherein the second trace comprises:
       a lower trace portion that directly contacts the top dielectric layer,
       a sidewall trace portion that directly contacts at least one sidewall of the second metal bump, and
       an upper trace portion that directly contacts the top surface of the second metal bump.

18. The method of claim 17, further comprising:
    depositing a second blanket dielectric layer over the second trace; and
    etching away a top portion of the second blanket dielectric layer to expose a top surface of the upper trace portion to form a bondable surface.

19. The method of claim 1, further comprising:
    forming a cross-directional trace directly on the first major surface prior to the forming the bump, wherein
       the cross-directional trace extends in a first direction,
       the trace comprising the lower, sidewall, and upper trace portions extends in a second direction perpendicular to the first direction, and
       the bump comprises a dielectric bump formed over and directly contacting a top surface and sidewalls of the cross-directional trace.

20. The method of claim 19, wherein
the cross-directional trace has a first height measured from the first major surface to the top surface of the cross-directional trace,
the dielectric bump has a second height measured from the first major surface to a top surface of the dielectric bump, the second height greater than the first height, and
the upper trace portion directly contacts the top surface of the dielectric bump and has a third height measured from the first major surface to the top surface of the upper trace portion, the third height greater than the second height.

* * * * *